United States Patent
Possanzini et al.

(10) Patent No.: US 7,602,188 B2
(45) Date of Patent: Oct. 13, 2009

(54) SYSTEM OF ELECTRIC COILS FOR TRANSMITTING AND RECEIVING RADIO-FREQUENCY MAGNETIC FIELDS IN A MAGNETIC-RESONANCE IMAGING APPARATUS, AND MAGNETIC-RESONANCE IMAGING APPARATUS PROVIDED WITH SUCH A SYSTEM OF ELECTRIC COILS

(75) Inventors: Cecilia Possanzini, Eindhoven (NL); Marinus Johannes Adrianus Maria Van Helvoort, Eindhoven (NL); Jan Bertus Marten Warntjes, Eindhoven (NL); Robert Paul Kleihorst, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 11/572,714

(22) PCT Filed: Jul. 12, 2005

(86) PCT No.: PCT/IB2005/052308
§ 371 (c)(1),
(2), (4) Date: Jan. 26, 2007

(87) PCT Pub. No.: WO2006/013482
PCT Pub. Date: Feb. 9, 2006

(65) Prior Publication Data
US 2008/0054903 A1    Mar. 6, 2008

(30) Foreign Application Priority Data
Jul. 29, 2004    (EP)    .................................. 04103660

(51) Int. Cl.
*G01V 3/00*    (2006.01)
(52) U.S. Cl. ..................................................... 324/318
(58) Field of Classification Search .................. 324/318
See application file for complete search history.

(56) References Cited

U.S. PATENT DOCUMENTS 4,752,738 A * 6/1988 Patrick et al. ............... 324/318

(Continued)

FOREIGN PATENT DOCUMENTS

EP    1 004 885 A2    5/2000

(Continued)

*Primary Examiner*—Brij B. Shrivastav
*Assistant Examiner*—Megannn E Vaughn

(57) ABSTRACT

The invention relates to a magnetic-resonance imaging (MRI) apparatus comprising an electrical coil system (17) for transmitting and receiving a radio-frequency (RF) magnetic field from an examination volume (3) of the MRI apparatus. The electrical coil system (17) comprises at least one surface coil (35) which extends substantially in a plane. The surface coil is used for transmitting and/or receiving a RF magnetic field which is oriented substantially perpendicularly to the plane of the surface coil (35). The surface coil (35) has a main coil axis (37). When the MRI apparatus is in use, the main coil axis (37) extends substantially parallel to a main magnetic field in the examination volume (3) of the MRI apparatus. On both sides of the main coil axis (37), the surface coil (35) comprises an electrically conducting element (39) which extends substantially parallel to the main coil axis (37). To provide a surface coil (35) which transmits more homogeneous RF magnetic fields and/or has a more homogeneous sensitivity for received RF magnetic fields than known surface coils, at least one of the electrically conducting elements (39) of the surface coil (35) comprises at least two electric conductors (41). With respect to their distance to the main coil axis (37), these electric conductors (41) are positioned at a relatively short distance from each other. In the plane of the surface coil (35), the electric conductors (41) extend substantially parallel to the main coil axis (37) of the surface coil (35).

16 Claims, 3 Drawing Sheets

U.S. PATENT DOCUMENTS

| | | |
|---|---|---|
| 6,060,882 A | 5/2000 | Doty |
| 6,172,503 B1 | 1/2001 | Mori |
| 6,249,121 B1 | 6/2001 | Boskamp et al. |
| 6,965,232 B2 * | 11/2005 | Sodickson .................. 324/307 |
| 2003/0071623 A1 | 4/2003 | Marek |
| 2003/0231018 A1 | 12/2003 | Willig-Onwuachi et al. |

FOREIGN PATENT DOCUMENTS

| | | |
|---|---|---|
| EP | 1 113 285 A2 | 7/2001 |
| EP | 1 113 286 A2 | 7/2001 |
| WO | 2005012931 A1 | 2/2005 |

* cited by examiner

SYSTEM OF ELECTRIC COILS FOR TRANSMITTING AND RECEIVING RADIO-FREQUENCY MAGNETIC FIELDS IN A MAGNETIC-RESONANCE IMAGING APPARATUS, AND MAGNETIC-RESONANCE IMAGING APPARATUS PROVIDED WITH SUCH A SYSTEM OF ELECTRIC COILS

BACKGROUND

The invention relates to a magnetic-resonance imaging (MRI) apparatus comprising a system of electric coils for transmitting and receiving radio-frequency (RF) magnetic fields in an examination volume of the MRI apparatus, said system comprising at least one surface coil extending substantially in a plane for transmitting and/or receiving a RF magnetic field directed substantially perpendicularly to the plane of the surface coil, in which the surface coil has a main coil axis which, in an operating state of the system, is oriented substantially parallel to the direction of a main magnetic field in the examination volume of the MRI apparatus, and in which the surface coil has an electrically conducting element on both sides of the main coil axis, which element extends substantially parallel to the main coil axis.

The invention also relates to a system of electric coils for transmitting and receiving RF magnetic fields in an examination volume of such a MRI apparatus.

Magnetic-resonance imaging (MRI) apparatuses of the type described in the opening paragraph and systems of electric coils for transmitting and receiving radio-frequency (RF) magnetic fields in an examination volume of such a MRI apparatus are generally known. MRI apparatuses can be used for imaging the internal parts of a patient's body, using the principle of nuclear spin resonance. A MRI apparatus comprises an examination volume, a main magnetic system for generating a uniform and relatively strong main magnetic field in the examination volume, a gradient coil system for generating gradients of the main magnetic field in three orthogonal directions, and a system of electric coils for transmitting and receiving RF magnetic fields in the examination volume. The system of electric coils for transmitting and receiving RF magnetic fields in the examination volume of a MRI apparatus may comprise a coil system which both transmits and receives RF magnetic fields, or a first coil system which comprises at least one transmitting coil for transmitting RF magnetic fields and a second coil system which comprises at least one receiving coil for receiving RF magnetic fields.

The simplest embodiments of a system of electric coils for transmitting and receiving RF magnetic fields comprise surface coils. Surface coils are generally known. They extend substantially in a curved or non-curved plane. Surface coils are often used as receiving coils because they can be positioned so close to a patient that signals having a better signal-to-noise ratio can be realized than when using other types of coils for receiving RF magnetic fields. Surface coils may also be used as transmitting coils for transmitting RF magnetic fields. If desired, some types of surface coils may be formed in a flexible way so that they can be wound around a patient to some extent.

Known surface coils for transmitting and/or receiving RF magnetic fields have the drawback that they transmit a RF magnetic field which is non-homogeneous in the volume and/or have a sensitivity to RF magnetic fields which is non-homogeneous in the volume. RF magnetic fields which are non-homogeneous in the volume and are transmitted by the surface coil, as well as the sensitivity to the RF magnetic fields received by surface coils, which sensitivity is non-homogeneous in the volume, increase as the distance to the electrically conducting elements extending substantially parallel to the main coil axis of the surface coil decreases, the largest increase taking place in the proximity of these electrically conducting elements. Consequently, a signal having a relatively satisfactory signal-to-noise ratio can be obtained from tissue proximate to the surface coil, whereas the signal-to-noise ratio of the obtained signal becomes worse as the signal comes from tissue which is further remote from the surface coil. Consequently, MR images obtained by means of such simple surface coils exhibit artefacts which are very disturbing due to the fact that one is mostly interested in tissue which is further remote from the surface coil.

BRIEF SUMMARY

It is an object of the invention to provide a magnetic-resonance imaging apparatus of the type described in the opening paragraph, comprising a surface coil for transmitting and/or receiving RF magnetic fields, in which the coil, when used as transmitting coil situated in the proximity of the electrically conducting elements extending substantially parallel to the main coil axis of the surface coil, transmits RF magnetic fields which are more homogeneous in the volume than the known surface coils, and in which the coil, when used as a receiving coil situated in the proximity of the electrically conducting elements of the surface coil extending substantially parallel to the main coil axis of the surface coil, has a sensitivity to the RF magnetic fields received by the surface coil which is more homogeneous in the volume than the known surface coils, so that MR images having fewer artefacts than is possible with the known surface coils are obtained.

According to the invention, the envisaged object is achieved by a magnetic-resonance imaging apparatus of the type described in the opening paragraph and is characterized in that at least one of the electrically conducting elements of the surface coil comprises at least two electric conductors which, with respect to their distance to the main coil axis, are positioned at a relatively short distance from each other and extend substantially parallel to the main coil axis in the plane of the surface coil.

The system of electric coils according to the invention is characterized in that at least one of the electrically conducting elements of the surface coil comprises at least two electric conductors which, with respect to their distance to the main coil axis, are positioned at a relatively short distance from each other and extend substantially parallel to the main coil axis in the plane of the surface coil.

The invention is based on the recognition that the phenomena of a RF magnetic field which is non-homogeneous in the volume and is transmitted by a surface coil, and a sensitivity to a RF magnetic field received by a surface coil, which sensitivity is non-homogeneous in the volume, both of which increase as the distance to an electrically conducting element extending substantially parallel to the main coil axis of the surface coil decreases, with the largest increase taking place in the proximity of the electrically conducting element, can be counteracted by widening the electrically conducting element of the surface coil. However, as is generally known, disturbing eddy currents are then produced in the electrically conducting element when transmitting and/or receiving RF magnetic fields, which eddy currents also result in artefacts in the MR images. By forming the relevant electrically conducting element of the surface coil with at least two electric conductors which, with respect to their main coil axis, are positioned at a relatively short distance from each other and extend substantially parallel to the main coil axis in the plane of the surface coil, rather than by widening the relevant electrically conducting element of the surface coil, it is realized that the relevant electrically conducting element is effectively widened without disturbing eddy currents being produced therein. It is thereby achieved that, as compared with the known surface coils, the surface coil transmits RF magnetic fields which are more homogeneous in the volume than the known surface coils, and/or has a sensitivity to the RF magnetic fields received by the surface coil, which is more homogeneous in the volume.

An embodiment of the system of electric coils according to the invention is characterized in that the electrically conducting elements on both sides of the main coil axis comprise at least two electric conductors each, which, with respect to their distance to the main coil axis, are positioned at a relatively short distance from each other and extend substantially parallel to the main coil axis in the plane of the surface coil.

A further embodiment of the system of electric coils according to the invention is characterized in that the electrically conducting elements on both sides of the main coil axis are positioned symmetrically with respect to the main coil axis and comprise equal numbers of electric conductors which, with respect to their distance to the main coil axis, are positioned at a relatively short distance from each other and extend substantially parallel to the main coil axis in the plane of the surface coil. This embodiment has the advantage that it realizes a RF magnetic field which is transmitted as homogeneously as possible in the volume and/or a sensitivity to received RF magnetic fields, which is as homogeneous as possible in the volume, and which increase per unit of distance to only a small extent as the distance to the surface coil decreases.

These and other aspects of the invention are apparent from and will be elucidated with reference to the embodiments described hereinafter.

DETAILED DESCRIPTION

Figure 1:
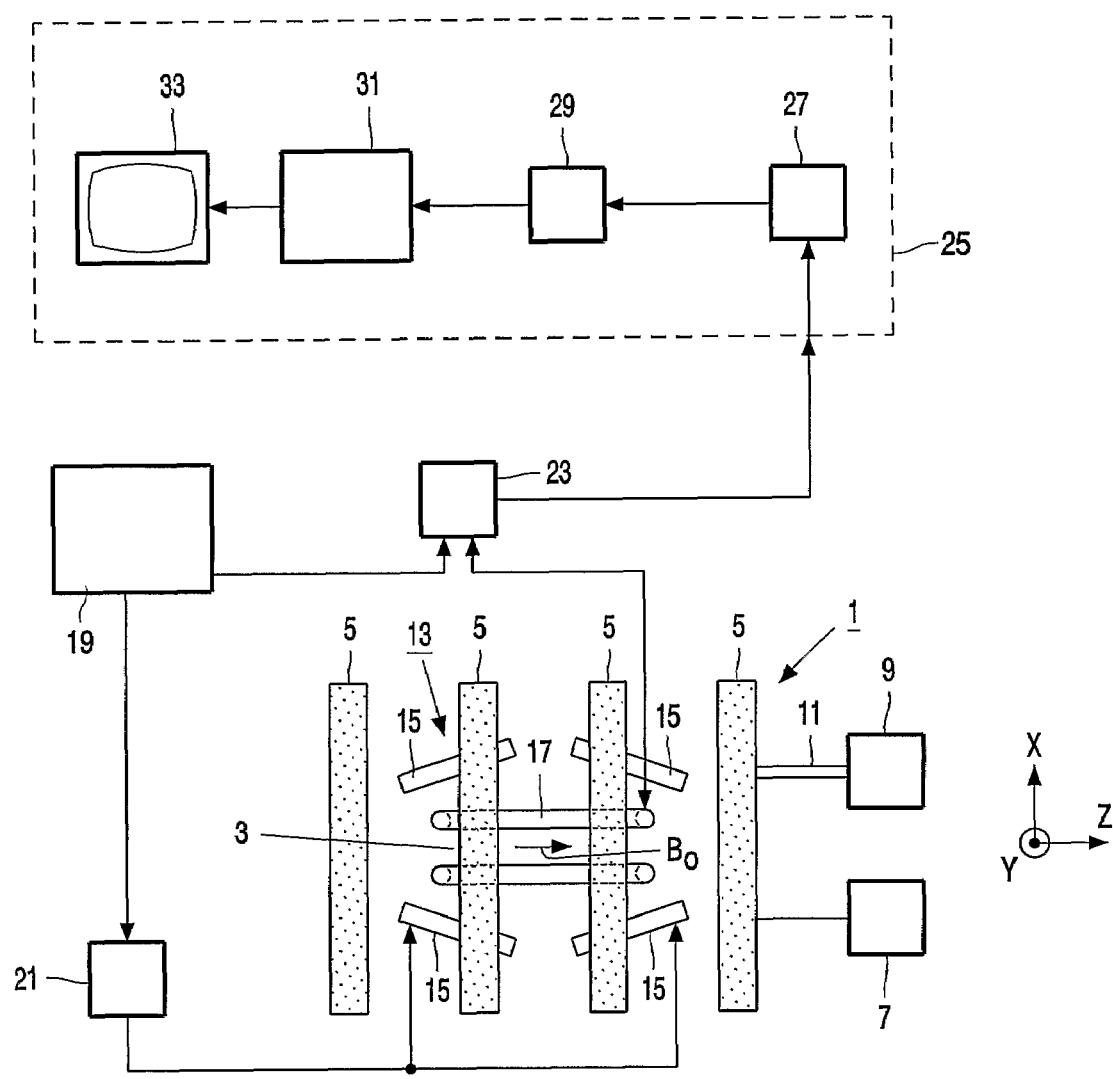
FIG. 1 is a general diagrammatic view of a magnetic-resonance imaging (MRI) apparatus comprising a system of electric coils for transmitting and receiving radio-frequency (RF) magnetic fields in an examination volume of an MRI apparatus.

FIG. 1 is a general diagrammatic view of a magnetic-resonance imaging (MRI) apparatus according to the invention. The MRI apparatus comprises a main magnetic system 1 surrounding an examination volume 3 in which a patient to be examined can be positioned. The main magnetic system 1 comprises a plurality of superconducting electric coils 5 with which a uniform and relatively strong main magnetic field $B_0$ can be generated in the examination volume 3 and which extends in a direction indicated as z direction in the Figure.

The MRI apparatus comprises an electric supply 7 for the superconducting electric coils 5 and a cryogenic cooling system 9 with cooling ducts 11 for cooling the superconducting electric coils 5. The MRI apparatus further comprises a gradient coil system 13 which is positioned between the main magnetic system 1 and the examination volume 3 and comprises a plurality of electric coils 15 (gradient coils) for generating gradients of the main magnetic field $B_0$ in three mutually orthogonal directions. Moreover, the MRI apparatus comprises a system of electric coils 17 according to the invention for transmitting and receiving radio-frequency (RF) magnetic fields directed substantially perpendicularly to the main magnetic field $B_0$ in the examination volume 3. The part of this system of electric coils 17 with which the RF magnetic fields are transmitted in the examination volume 3 (RF transmitting coils) is usually situated between the gradient coil system 13 and the examination volume 3, whereas the part of this system of electric coils 17 with which the RF magnetic fields are received from the examination volume 3 (RF receiving coils) comprises a surface coil extending substantially in a plane which, in the operating state of the MRI apparatus, is positioned in the proximity of a patient situated at least partly in the examination volume 3. In the specific case, in which a surface coil extending substantially in a plane is used as a RF transmitting coil, it is also positioned in the proximity of a patient who is to be examined and is situated at least partly in the examination volume 3. For the sake of clarity, the surface coils extending substantially in a plane are not further shown in FIG. 1.

Images of the internal parts of a patient's body can be made with the MRI apparatus, using the principle of nuclear spin resonance. Images of internal parts of the patient's body can be constructed by placing the part of the patient's body to be imaged in the examination volume 3 in the main magnetic field $B_0$ and by subsequently selecting consecutive target positions in the body by means of varying gradients of the main magnetic field $B_o$, for which the nuclear spin resonance effects are registered. The gradients of the main magnetic field $B_0$ can be varied by varying the current through the gradient coils 15 by means of a control unit 19 and a power amplifier 21. For each selected target position of the patient's body, a RF magnetic field directed substantially perpendicularly to the main magnetic field $B_0$ is transmitted by the RF transmitting coils at a predetermined frequency and duration so as to generate nuclear spin resonance effects on the selected position. Subsequently, a RF magnetic field also directed substantially perpendicularly to the direction of the main magnetic field $B_o$ and produced as a result of these nuclear spin resonance effects is received by the RF receiving coil extending substantially in a plane. Both the system of electric coils 17 for transmitting and receiving RF magnetic fields and the electric coils 15 of the gradient coil system 13 are controlled by the control unit 19. The control unit 19 also supplies a control signal to a transmitting and receiving unit 23. The transmitting and receiving unit 23 supplies a current to the RF transmitting coil so as to allow transmission of the required RF magnetic fields in the examination volume 3. The transmitting and receiving unit 23 also receives a current from the RF receiving coil, which current is generated in this receiving coil as a result of the RF magnetic field in the examination volume. A signal is applied from the transmitting and receiving unit 23 to a processor 25 of the MRI apparatus, ensuring that the signals originating from the transmitting and receiving unit 23 are converted into an image. To be able to realize this, the processor 25 successively comprises a signal amplifier 27, a demodulator 29, an image construction unit 31 and a display screen 33.

Figure 2:
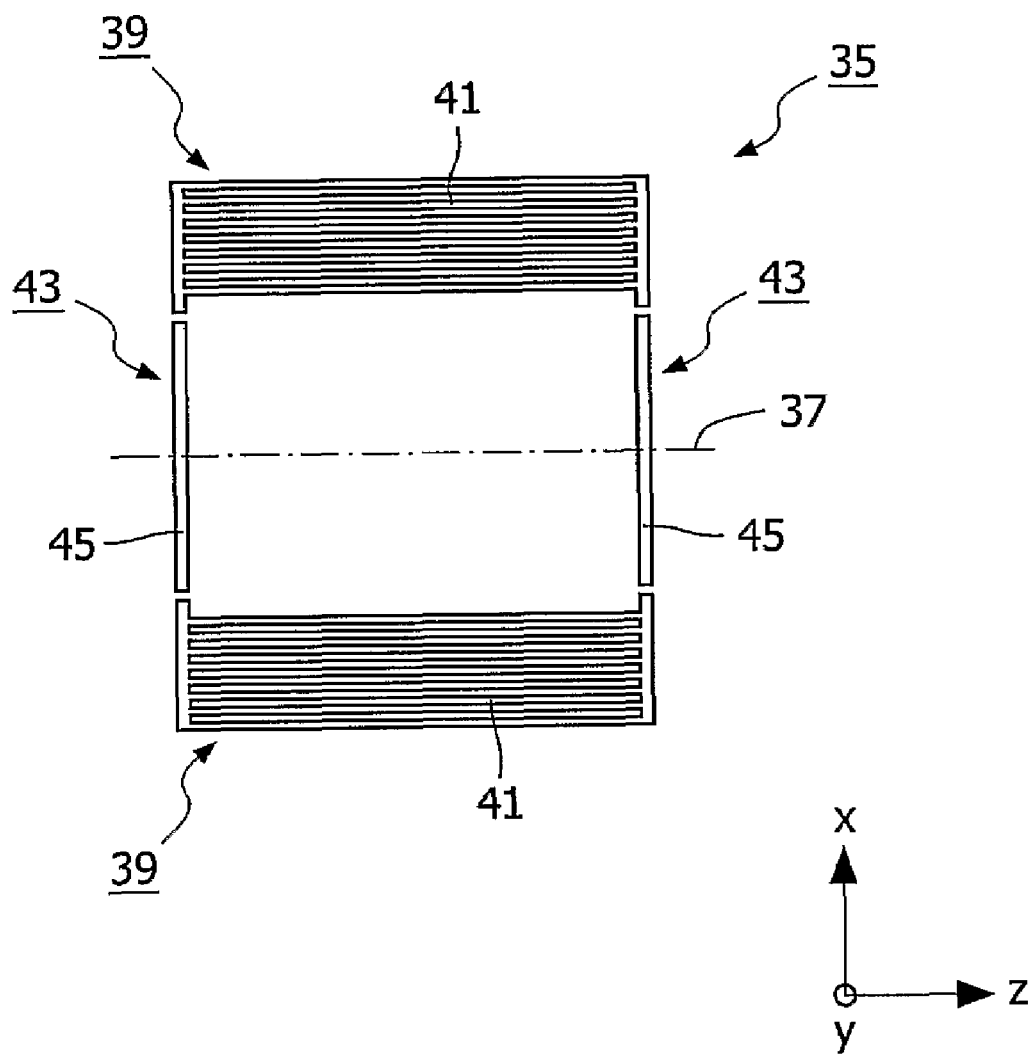
FIG. 2 is a diagrammatic view of a surface coil according to the invention for use in the system of electric coils shown in FIG. 1.

FIG. 2 is a diagrammatic view of a surface coil 35 according to the invention, forming part of a system of electric coils 17 according to the invention. In the embodiment shown, the surface coil 35 is a rectangular surface coil 35 extending substantially in a plane for transmitting and/or receiving RF magnetic fields directed substantially perpendicularly to the plane of the surface coil 35. The surface coil 35 has a main coil axis 37 extending through the center of the coil, which main coil axis, in the operating state, is oriented parallel to the direction of the main magnetic field $B_0$ indicated as z direction in the Figure. On both sides of the main coil axis 37, the surface coil 35 comprises an electrically conducting element 39 comprising a plurality of electric conductors 41 which extend substantially parallel to the main coil axis 37. Perpendicular to the main coil axis 37, the surface coil 35 comprises two electrically conducting elements 43 each comprising only one electric conductor 45.

The RF magnetic fields directed substantially perpendicularly to the plane of the surface coil 35 are mainly transmitted and/or received by the electrically conducting elements 39. The electrically conducting elements 43 are mainly used for interconnecting the electrically conducting elements 39. The electrically conducting elements 39, mainly responsible for transmitting and/or receiving the RF magnetic fields, each comprise a plurality of electric conductors 41 which ensure that the conducting elements 39 are effectively widened without disturbing eddy currents being produced therein. Consequently, RF magnetic fields that are more homogeneous in the volume can be transmitted by the surface coil 35 and/or a more homogeneous sensitivity to the RF magnetic fields received by the surface coil is possible than in the case in which the electrically conducting elements 39 would comprise one electric conductor only. Due to the fact that the electrically conducting elements 43 do not significantly contribute to transmitting and/or receiving RF magnetic fields through the surface coil 35 and, consequently, have only little influence on the homogeneity of the RF magnetic fields transmitted by the surface coil 35 and/or on the homogeneity of the sensitivity to RF magnetic fields received by the surface coil 35, an embodiment with only one electric conductor 45 is sufficient for these conducting elements 43.

In a practical embodiment, the surface coil 35, particularly when used as RF receiving coil, is preferably provided with a plurality of capacitors (not shown in FIG. 2). By means of these capacitors, the RF receiving coil 35 can be tuned in such a way that it is suitable for receiving RF magnetic fields at the specific frequency which are produced as a result of the nuclear spin resonance effects. Moreover, capacitors can be used for regulating the currents through the substantially parallel extending electric conductors 41 of the surface coil 35 and, in addition to the separate electric conductors 41, serve as extra means for preventing disturbing eddy currents from being produced in the surface coil 35.

Figure 3A:
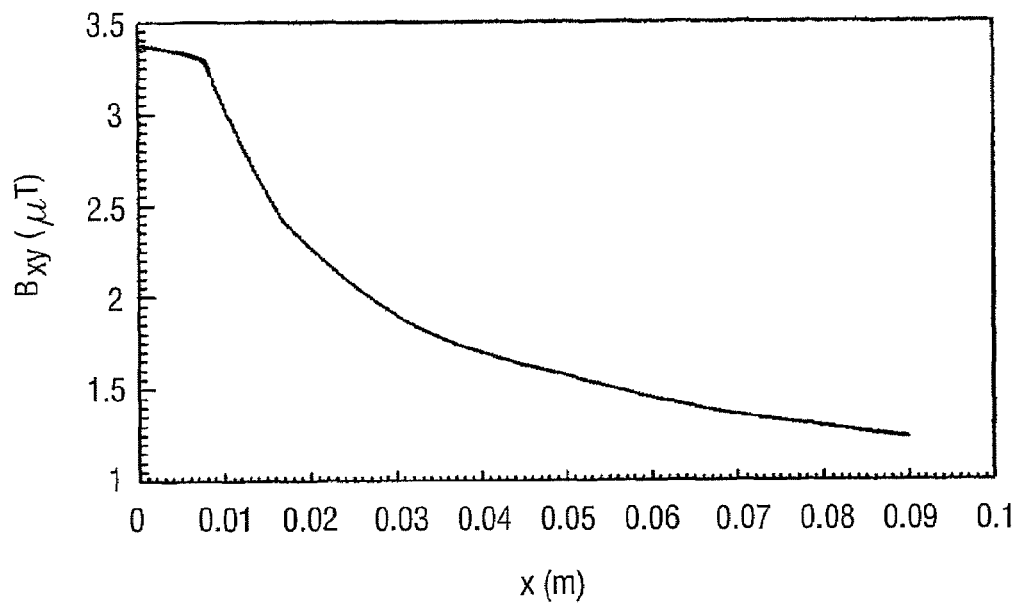
FIG. 3a is a graph of data experimentally obtained about the sensitivity of a known rectangular RF surface coil used as a receiving coil.
Figure 3B:
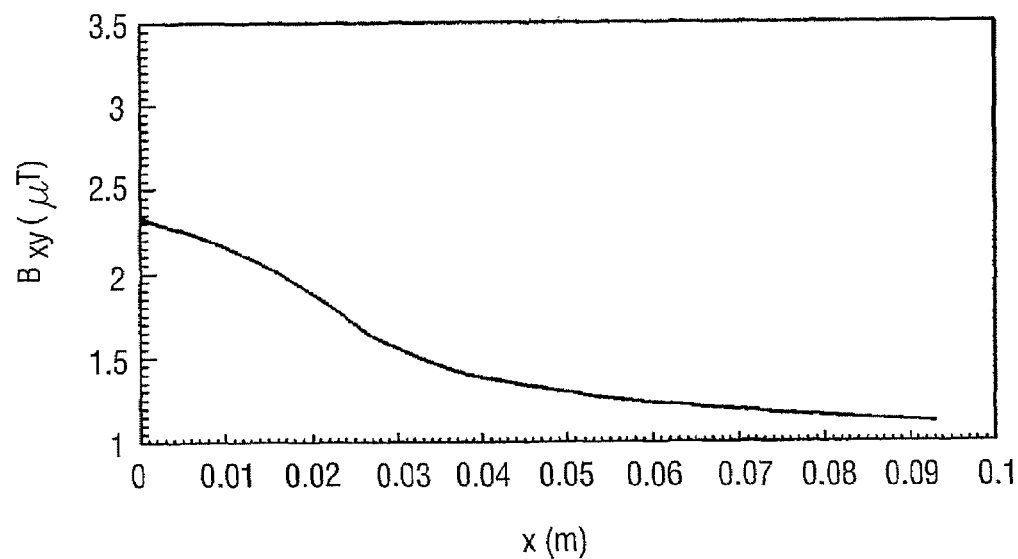
FIG. 3b is a graph of data experimentally obtained about the sensitivity of a rectangular RF surface coil according to the invention, used as a receiving coil.

FIG. 3a is a graph of an experimentally obtained sensitivity profile of a known rectangular surface coil as RF receiving coil, while FIG. 3b shows a graph of an experimentally obtained sensitivity profile of a rectangular surface coil as RF receiving coil 35 according to the invention, in which an electrically conducting element 39 comprising a plurality of electric conductors 41 is situated on only one side of the main coil axis 37 of the coil 35. Both RF receiving coils 35 used have equal dimensions. In a direction corresponding to a direction indicated as x direction in FIG. 2, the distance up to the center of the electrically conducting element 39 is plotted on the horizontal axis of both graphs, whereas the magnitude of the RF magnetic field received by the RF receiving coil 35 is plotted on the vertical axis.

Generally it holds that the RF magnetic fields transmitted by a surface coil 35 and/or the sensitivity profiles of RF magnetic fields received by a surface coil 35 become more homogeneous as the effective width of the electrically conducting element 39 increases. In FIGS. 3a and 3b, this is clearly visible for the RF receiving coil 35, due to the considerably lower RF magnetic field (indicated as $B_{xy}$ in FIGS. 3a and 3b) which is received by the receiving coil 35 in the center of the electrically conducting element 39 when it is formed with a plurality of separate electric conductors 41 instead of with only one electric conductor. FIGS. 3a and 3b also show that the effective widening of the electrically conducting element 39 leads to a less larger increase per unit of distance (gradient) of the sensitivity of the RF receiving coil 35 as the distance to the electrically conducting element 39 decreases in the x direction. It will be evident to those skilled in the art that the RF magnetic fields transmitted by a surface coil 35 and/or the sensitivity profiles for RF magnetic fields received by a surface coil 35 become more homogeneous when, instead of only on one side of the main coil axis 37, the surface coil 35 is formed on both sides of the main coil axis 37 with electrically conducting elements 39 that are effectively widened by separate electric conductors 41, and that the most homogeneous transmitted RF magnetic fields and/or the most homogeneous sensitivity profiles for received RF magnetic fields are obtained when the electrically conducting elements 39 are positioned symmetrically with respect to the main coil axis 37 and are provided with equal numbers of electric conductors 41.

Factors which are also important for obtaining RF magnetic fields transmitted by a surface coil 35 and being as homogeneous as possible in the volume, and/or sensitivity profiles of RF magnetic fields received by a surface coil 35 and extending as homogeneously as possible in the volume are the number of electric conductors 41, the width of these conductors 41 and the mutual distance between these conductors 41. It has been found that surface coils 35 in which the electrically conducting elements 39 are effectively widened on both sides of the main coil axis 37 of the surface coil 35, such that these elements 39 occupy about half the total surface surrounded by the surface coil 35, and in which the width of these separate conductors 41 is approximately equal to the mutual distance between the electric conductors 41, are eminently suitable for obtaining very homogeneous RF magnetic fields transmitted by the surface coil 35 and/or very homogeneous sensitivity profiles for RF magnetic fields received by the surface coil 35.

Of course, not only rectangular surface coils are suitable for realizing RF magnetic fields transmitted by surface coils and being very homogeneous in the volume and/or sensitivity profiles, which are very homogeneous in the volume, for RF magnetic fields received by the surface coil, but in principle all surface coils can be provided with electrically conducting elements 39 which are effectively widened by means of a plurality of separate conductors 41. A plurality of surface coils according to the invention may also be mutually combined so as to form a series of surface coils having RF magnetic fields transmitted by the surface coils and being very homogeneous in the volume and/or sensitivity profiles, which are very homogeneous in the volume, for RF magnetic fields received by the surface coils, with which it is possible to simultaneously image, with a satisfactory signal-to-noise ratio, larger internal parts of a patient's body than would be possible with one surface coil.

Finally, it is to be noted that surface coils according to the invention are eminently suitable for use in combination with the known SENSE imaging technique. SENSE (SENSitivity Encoding) is a technique in which a plurality of RF receiving coils is simultaneously used for receiving RF magnetic fields, such that imaging internal parts of a patient's body is possible with a better resolution or within a shorter period of time than in the case without SENSE. Essential for the use of SENSE is that the separate RF receiving coils have a sensitivity to the RF magnetic fields received by these coils, which is as homogeneous as possible. Based on this homogeneous sensitivity, corrections can be performed on the measuring results so that the period of time required for imaging the internal parts of a patient's body is reduced. A homogeneous sensitivity of the separate RF receiving coils is also important in SENSE so as to prevent artefacts in the ultimate MR images such as are caused, for example, by the patient's respiration during imaging. The homogeneous sensitivity of the RF receiving coils required for SENSE is realized by surface coils according to the invention.

The invention claimed is:

1. A magnetic resonance imaging apparatus comprising a system of electric coils for transmitting and receiving radio-frequency magnetic fields in an examination volume of the MRI apparatus, said system comprising at least one surface coil extending substantially in a plane for transmitting and/or receiving a RF magnetic field directed substantially perpendicularly to the plane of the surface coil, in which the surface coil has a main coil axis which, in an operating state of the system, is oriented substantially parallel to the direction of a main magnetic field in the examination volume of the MRI apparatus, and in which the surface coil has an electrically conducting element group on both sides of the main coil axis, each conducting element group being disposed a first distance from the main coil axis and extending substantially parallel to the main coil axis, at least one of the electrically conducting element groups including at least two electric conductors which are positioned a shorter distance from each other than the first distance and extend substantially parallel to the main coil axis in the plane of the surface coil.

2. The apparatus as claimed in claim 1, wherein the electrically conducting element groups on both sides of the main coil axis comprise at least two electric conductors each, which are positioned a shorter distance from each other than the first distance and extend substantially parallel to the main coil axis in the plane of the surface coil.

3. The apparatus as claimed in claim 2, wherein the electrically conducting element groups on both sides of the main coil axis are positioned symmetrically with respect to the main coil axis and comprise equal numbers of electric conductors which are positioned a shorter distance from each other than the first distance and extend substantially parallel to the main coil axis in the plane of the surface coil.

4. The system according to claim 3, wherein a plurality of surface coils are combined to form the system of electric coils, the plurality of surface coils transmit homogeneous RF magnetic fields.

5. The apparatus according to claim 3, wherein a plurality of surface coils are combined to form the system of electric coils, the plurality of surface coils receive homogeneous RF magnetic fields for sensitivity encoding (SENSE).

6. The apparatus according to claim 2, wherein a plurality of surface coils are combined to form the system of electric coils, the plurality of surface coils transmit homogeneous RF magnetic fields.

7. The apparatus according to claim 2, wherein a plurality of surface coils are combined to form the system of electric coils, the plurality of surface coils receive homogeneous RF magnetic fields for sensitivity encoding (SENSE).

8. The apparatus according to claim 1, wherein a plurality of surface coils are combined to form the system of electric coils, the plurality of surface coils transmit homogeneous RF magnetic fields.

9. The apparatus according to claim 1, wherein a plurality of surface coils are combined to form the system of electric coils, the plurality of surface coils receive homogeneous RF magnetic fields for sensitivity encoding (SENSE).

10. A magnetic resonance imaging apparatus comprising a system of electric coils for transmitting and receiving radio-frequency magnetic fields in an examination volume of the MRI apparatus, said system comprising at least one surface coil extending substantially in a plane for transmitting and/or receiving a RF magnetic field directed substantially perpendicularly to the plane of the surface coil, in which the surface coil has a main coil axis which, in an operating state of the system, is oriented substantially parallel to the direction of a main magnetic field in the examination volume of the MRI apparatus, and in which the surface coil has an electrically conducting element on both sides of the main coil axis, which element extends substantially parallel to the main coil axis and is positioned a distance from the main coil axis, at least one of the electrically conducting elements of the surface coil includes at least two electric conductors which are positioned a shorter distance from each other than the distance of the electrically conducting element from the main coil axis and extend substantially parallel to the main coil axis in the plane of the surface coil; and
wherein the surface coil is a loop coil in which current flows in opposite direction through the electrically conducting elements and in a common direction through the at least two electrical conductors of the at least one electrically conducting elements.

11. The apparatus according to claim 10, wherein the surface coil is planar.

12. A system of electric coils for transmitting or receiving RF magnetic fields in an examination volume of a MRI apparatus, including:
at least one surface planar loop coil having a main coil axis that is oriented substantially parallel to the direction of a main magnetic field in the examination volume of an MRI apparatus for transmitting and/or receiving an RF field transmitted substantially perpendicular to the surface loop coil, wherein the surface loop coil includes:
a first electrically conducting element disposed a distance from the main coil axis and on one side of the main coil axis and extending substantially parallel thereto along the length of the surface coil,
a second electrically conducting element disposed a distance from the main coil axis on an opposite side of the main coil axis from the first electrically conducting element and extending substantially parallel to the main coil axis,
a pair of end conducting elements that connect to the first and second electrically conducting elements such that current flows in opposite directions in the first and second electrically conducting elements, and
wherein at least one of the first and second electrically conducting elements is divided into a plurality of parallel conductors, the parallel conductors in each of the first and second electrically conducting element being closer than the distance from the main coil axis to the electrically conducting elements.

13. The system according to claim 12, wherein both of the first and second conducting elements are divided into a plurality of parallel conductors.

14. The system according to claim 13, wherein the first and second electrically conducting elements are spaced equidistantly from the main coil axis.

15. The system according to claim 12, wherein the first and second electrically conducting elements and the end conducting elements lie in a common plane.

16. The system according to claim 12, wherein the end conducting elements are single conducting elements.

* * * * *